(12) United States Patent
Annampedu

(10) Patent No.: US 6,856,183 B2
(45) Date of Patent: Feb. 15, 2005

(54) SCHEME TO IMPROVE PERFORMANCE OF TIMING RECOVERY SYSTEMS FOR READ CHANNELS IN A DISK DRIVE

(75) Inventor: Viswanath Annampedu, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 466 days.

(21) Appl. No.: 09/976,854

(22) Filed: Oct. 12, 2001

(65) Prior Publication Data

US 2003/0072099 A1 Apr. 17, 2003

(51) Int. Cl.[7] ............................................. H03L 7/06
(52) U.S. Cl. ............................. 327/159; 327/3; 360/53
(58) Field of Search ........................ 327/2–3, 12, 156, 327/159; 360/15, 46, 53, 67, 51, 45

(56) References Cited

U.S. PATENT DOCUMENTS

| | | | |
|---|---|---|---|
| 5,521,948 A | * | 5/1996 | Takeuchi .................... 375/376 |
| 5,986,830 A | | 11/1999 | Hein ............................ 360/45 |
| 5,987,562 A | | 11/1999 | Glover ........................... 711/4 |
| 6,023,383 A | | 2/2000 | Glover et al. ................. 360/46 |
| 6,111,712 A | | 8/2000 | Vishakhadatta et al. ...... 360/51 |
| 6,208,478 B1 | | 3/2001 | Chiu et al. .................... 360/51 |
| 6,308,298 B1 | * | 10/2001 | Blatchley et al. ........... 714/775 |

OTHER PUBLICATIONS

Aziz, Pervez M. et al., Symbol Rate Timing Recovery for Higher Order Partial Response Channels, IEEE Journal on Selected Areas in Communications, vol. 9, No. 4, Apr. 2001, pp. 635–648.

* cited by examiner

Primary Examiner—Dinh T. Le

(57) ABSTRACT

A digital phase lock loop circuit including an error generation circuit for generating at least three error signals and a phase error adjustment circuit for generating at least one phase error adjustment signal from the at least three error signals. By using at least three error signals, as opposed to just one, the drift in the sampling phase of the recovered clock is easily detected and corrected to reduce burst errors and to improve loss of lock (LOL) performance.

27 Claims, 7 Drawing Sheets

SCHEME TO IMPROVE PERFORMANCE OF TIMING RECOVERY SYSTEMS FOR READ CHANNELS IN A DISK DRIVE

FIELD OF THE INVENTION

This present invention relates data storage systems, and in particular, read channel devices for reading out information stored in data storage systems.

BACKGROUND OF THE INVENTION

Read channel devices serve as interfaces between a hard disk on which digital information is stored and external devices (e.g., Central Processing Unit (CPU)) which receive and process the digital information in various applications. Read channel devices take the analog information stored as magnetic pulses on the hard disk drive and convert that information into digital values (i.e., "1"s and "0"s) that are readable by digital devices, such as a CPU.

Timing recovery is an important aspect of many read channel devices. Timing recovery systems serve to recover a clock signal at the symbol rate that is both phase-locked and frequency-locked to the incoming data (i.e., from the hard disk). A typical read channel device utilizes a digital phase lock loop (DPLL) to perform timing recovery operations. A typical DPLL uses a phase detector to extract phase error information from the incoming signal. A loop filter filters the output of the phase detector using two integrators: a frequency register integrator, and a phase register integrator (e.g., Voltage Controlled Oscillator (VCO)).

A read channel device, such as the type used for reading information from a disk drive, generally operates as follows. An analog 'readback' signal (corrupted by noise) from a magnetic recording head (of a disk drive or other device) is first equalized to a partial response (PR) channel through filtering. The analog waveform generated by the PR equalizer is then sampled at a T sampling rate provided by the timing circuit to produce an analog sample. That analog sample is then digitized using an Analog to Digital (A/D) converter to obtain a digital output signal. The digital output of the A/D converter is often referred to as the 'Y' signal (See signal $Y_{kT}$ in FIG. 4 of the present application).

In the case of perfect equalization, perfect timing and generally perfect conditions, the above-described concept would be similar to passing random bits through a filter. For example, consider the PR channel to be filter having the filter coefficients [1 0-1]. Then, if random bits in the form [1 1-1-1 1 1 1 1-1-1] are passed to the PR channel, the output of the PR channel (which is obtained by convolving the input with channel filter) is then [-2-2 2 2 0 0-2-2]. This output is the uncorrupted 'Y' signal. That is, this is the signal obtained by equalizing the perfect 'readback' signal to a [1 0-1] PR channel, and then sampling and digitizing.

Note that for exemplary PR channel described above, the output levels are either 2, -2 or 0. These specific levels are often referred to as 'eye' levels. Often times, noise or other imperfections in the PR channel cause the digital output to contain values other than the ideal values. It should also be noted that the output of the exemplary PR channel (e.g., [1 0-1]) depends on the two previous bits, and the current bit, and hence has a memory of 2. Also, since the readback signal is almost always corrupted by noise, the obtained 'eye' levels will almost never be ideal. For example, a digital output of [-4-1 2 0 1-1-3-2] may be what is actually obtained, as opposed to the perfect output response (e.g., [-2-2 2 2 0 0-2-2]).

The difference between the actual A/D digital output signal ('Y') and the ideal 'eye' level (perfect or uncorrupted 'Y'. sometimes referred to as '$Y^1$') is often termed as the error signal (E__N). In order to determine this difference, the actual A/D digital output signal must be compared to an ideal digital output signal. One way to generate an ideal digital output signal is by passing the actual A/D digital output signal to a detector, such as a Viterbi detector. The Viterbi detector takes the actual digital output signal (e.g., the signal from the A/D converter) and produces an estimation of the actual data bits (e.g., 1s or -1s). Since the Viterbi detector only estimates the actual data bits based on the A/D output signal, it will be noted that errors may occur when the detector does not estimate correctly. Once the actual data bits are known they can be convolved with the PR channel filter to obtain the ideal 'eye' levels. This output of the ideal 'eye' levels is often termed '$Y^1$' (See signal $Y^1_{kT}$ in FIG. 4 of the present application). Of course, if the Viterbi detector makes errors in detecting the bits, the wrong ideal levels may be, obtained. Those of ordinary skill in the art will recognize that the more advanced detector, the better the decisions will be.

In a decision directed timing loop (such as the one described herein), decisions from the Viterbi detector (or other detector) are used to compute the bits, and hence the ideal levels and the error for the timing loop.

Another signal commonly referred to as a 'SLOPE' signal (See FIG. 1 of the present application) is also generated in the same manner as the '$Y^1$' signal discussed above (e.g., using a Viterbi detector to estimate the actual data bits). Again, only if the Viterbi detector detects the bits correctly will the 'SLOPE' signal be correct.

FIG. 1 shows a conventional digital phase lock loop (DPLL) circuit 100 for a read channel device. As shown, the DPLL circuit 100 includes a first multiplier 105 which receives an error signal E__N and a SLOPE signal from a Viterbi detector, and produces a phase error signal PE at its output. The PE signal is then input to second and third multipliers 110, 115. The second multiplier 110 also has a Frequency Gain signal input, and the third multiplier 115 also has a Phase Gain signal input. The output of the second multiplier 110 is transmitted to a first summer 120, and the output of the third multiplier is transmitted to a first adder 125. The first summer 120 takes the output of the second multiplier, and an output of a frequency register 130, and produces an output which is fed to the frequency register 130. The first adder 125 takes the output of the third multiplier 115, and an output of a frequency register 130, and produces an output which is fed to a second summer 135. The second summer 135 takes this signal, as well as an output signal from a phase register 140, and produces an output which is fed to the phase register 140. The output of the phase register 140 is then transmitted to a phase mixer 145. Finally, the phase mixer provides an output signal to control a voltage controlled oscillator (VCO).

In operation, the digital phase lock loop circuit 100 described above receives the error signal E__N, and modulates a control signal of a VCO so that a phase error is minimized. In particular, a Mean Squared Error (MSE) (computed by squaring each value of the signal E__N, and taking the average over all values) is minimized by the DPLL 100 of the present invention.

The DPLL 100 described above preferably includes a slope-based phase detector (PD). Slope-based phase detectors are also often referred to as Minimum Mean Squared Error Phase Detectors. It will be noted by those skilled in the art that other types of phase detectors exist and are also commonly used in DPLLs. Such other phase detectors include Maximum Likelihood Phase Detectors and Mueller and Muller ('M&M') Phase Detectors.

It is important that read channel devices have the ability to perform timing recovery at very low signal-to-noise ratios (SNRs). When a DPLL is unable to track an incoming waveform to provide accurate estimates of the sampling clock, various errors can occur in the received data. These errors often occur in bursts when the DPLL is not tracking the incoming waveform. These bursts occur because when the DPLL looses track of the incoming signal, the DPLL may not be able to reacquire the frequency and phase lock. These types of events are termed loss of lock (LOL) events.

Many conventional timing recovery systems operate utilizing a phase detector with a slope look-up table for determining the ideal waveform characteristics. The phase error produced by the phase detector is proportional to the product of the signal slope at the sampling instant and the error between the sampled value and the ideal value. The ideal value is the value corresponding to the perfectly equalized and perfectly sampled signal (at the symbol rate) without any noise or other imperfections. The read channel device employs a maximum likelihood Viterbi sequence detector algorithm to detect the data. In a decision directed loop, the ideal values at the symbol rate can be estimated by using the data stream itself, or by using earlier decisions from the sequence detector to avoid latency in obtaining the timing updates. After applying proper gains to the phase error, it is filtered by the loop filter using the frequency and phase integrators. The digital output of the loop filter controls an analog VCO which is capable of adjusting the sampling instant of the clock. The LOL performance strongly depends on the quality of the estimated ideal values. Better LOL performance is achieved by using accurate later decisions (with latency) in the sequence detector instead of using less accurate earlier decisions (without latency) to estimate the ideal sample values.

When a timing recovery system as described above is tracking the incoming waveform, the sampling instants will be very close to the ideal sampling instant. Thus, when a LOL event is about to happen, the sampling phase of the recovered clock drifts in one direction or the other from the ideal sampling instant.

Thus, there is currently a need for a timing recovery system which detects the direction and amount of this drift, and which uses this information to prevent a Loss of Lock event.

SUMMARY OF THE INVENTION

The present invention comprises a digital phase lock loop circuit including an error generation circuit for generating at least three error signals and a phase error adjustment circuit for generating at least one phase error adjustment signal from the at least three error signals.

The above and other advantages and features of the present invention will be better understood from the following detailed description of the exemplary embodiments of the invention which is provided in connection with the accompanying drawings.

DETAILED DESCRIPTION

The present invention comprises a method and apparatus for detecting the direction of the drift in the sampling phase of a clock, and also the amount of drift from the ideal sampling point. This information can then be used to modify the integrators in a loop filter to provide better sampling instants going forward in tracking the data. The present invention comprises both a detection and correction scheme to avoid Loss of Lock (LOL) events.

Currently, phase detectors (PDs) in digital phase locked loop (DPLL) circuits, such as DPLL 100 described above, use a single error signal (e.g., E_N(kT)) which is equal to the error between each sampled value and each ideal value at the sampling instant (symbol rate T). However, in the present invention, principles of interpolation are used to determine additional sample points which are used to generate additional error signals. Since the signal from which the error signal or signals is determined is often band-limited, it is possible to determine the initial ideal samples at a T sampling rate, and then interpolate the additional ideal samples at some other sampling rate, such as T/2. Thus, it is possible to discover ideal sample values at a T/2 sampling rate using the ideal values at the T sampling rate.

Using the above principles of interpolation, at any sampling point kT, three (3) errors can be computed. First, a normal error $E_{13}$ N(kT) at some definite sample point kT is computed. Then, E_POS(kT+T/2) may be computed as the error between the sample value at kT and the ideal sample value at kT+T/2 (i.e., an ideal sample point just slightly ahead of the ideal sample point at kT). Similarly, $E_{13}$ NEG(kT−T/2) is computed as the error between the sample value at kT and the ideal value at kT−T/2 (i.e., an ideal sample point just slightly behind the ideal sample point at kT).

Figure 2:
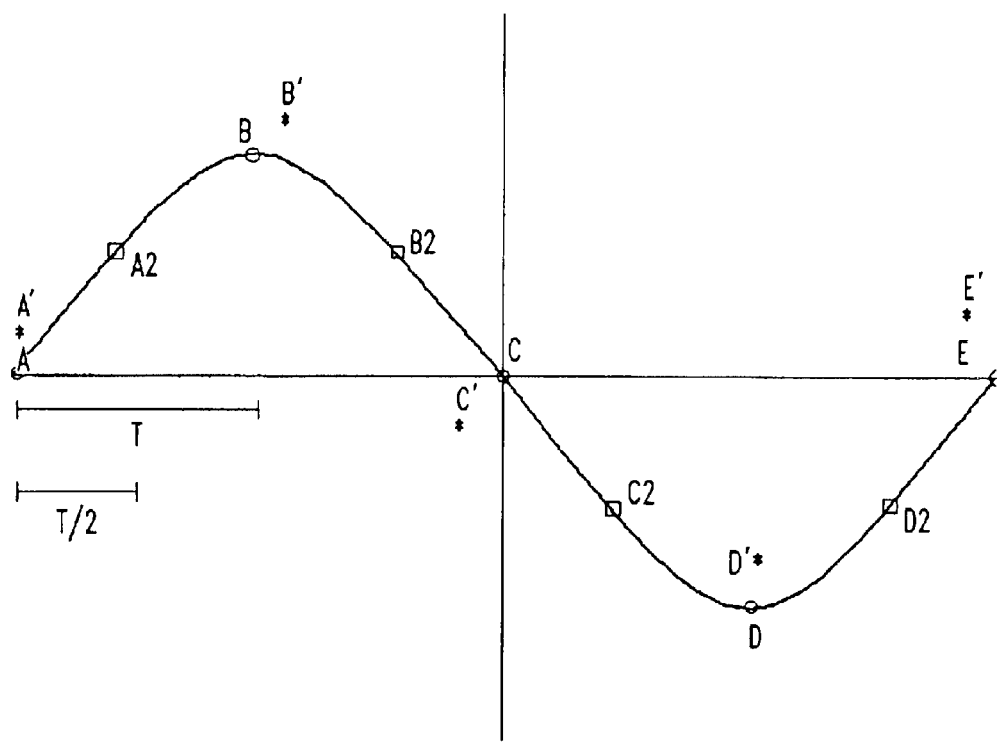
FIG. 2 shows a graph of an exemplary waveform and several sampling points produced by 2 times oversampling.

FIG. 2 shows a graph of an exemplary waveform sampled at a T/2 sampling rate (i.e., 2 times oversampling). As described above, by sampling at sampling rate T, several sample points may be obtained. These sample points may be denoted A'–E' as shown in FIG. 2. Sample points A–E shown in FIG. 2 comprise 'ideal' sample points (at T rate) corresponding to 'actual' sample points A'–E'. Then, interpolation using simple filters (e.g., [−2/16 9/16 9/16 −2/16]) may be utilized to achieve the additional ideal sample values at T/2. FIG. 2 shows the ideal samples A, B, C, D and E at T sampling rate, and the interpolated ideal samples A2, B2, C2 and D2 at T/2 sampling rate for a sinusoidal waveform. It should be noted that the interpolated point B2 can be obtained very accurately by using the above digital filter on the four sample points A, B, C and D (sampled at T sampling rate). This interpolation may be performed on not only sine waves, but also any other band-limited waveform.

Moreover, the ideal sample values may be obtained at a T/I sampling rate, for any I, using the ideal values at T rate, and then using appropriate digital interpolating filters. Table 1 illustrates exemplary digital filters for a few different values of 1.

| Interpolation at | Simple Digital Filters (Number of Taps: 4, Resolution: 1/16 th) | | | |
|---|---|---|---|---|
| T/8  | −1/16 | 2/16  | 15/16 | −1/16 |
| T/4  | −2/16 | 5/16  | 13/16 | −2/16 |
| 3T/8 | −2/16 | 7/16  | 11/16 | −2/16 |
| T/2  | −2/16 | 9/16  | 9/16  | −2/16 |
| 5T/8 | −2/16 | 11/16 | 7/16  | −2/16 |
| 3T/4 | −2/16 | 13/16 | 5/16  | −2/16 |
| 7T/8 | −1/16 | 15/16 | 2/16  | −1/16 |

Figure 3:
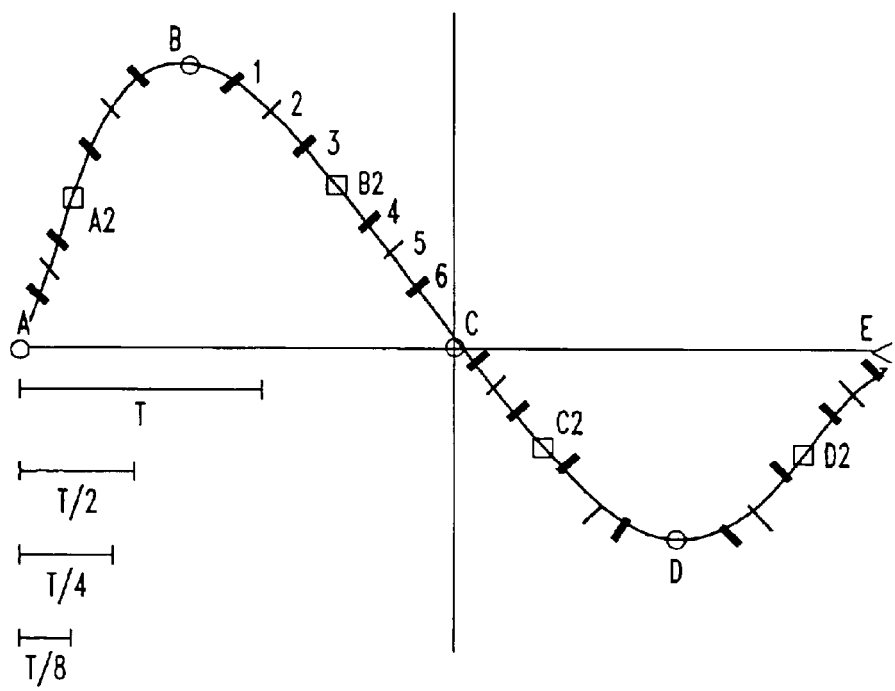
FIG. 3 shows a graph of an exemplary waveform and several sampling points produced by 8 times oversampling.

FIG. 3 shows a sample waveform which has T/8 sampling rate (i.e., 8 times oversampling). The seven interpolated points between the samples B and C are obtained by passing the four sample points A, B, C and D through the seven digital filters shown in Table 1.

For each actual sample point A', B', C', D' and E' discussed above with reference to FIGS. 2 and 3, an error signal E_N is generated. For example, with reference to FIG. 2, each actual sample point A', B', C', D', and E' has an associated error signal E_N. The error signal E_N associated with each actual sample A', B', C', D', and E' defines the error between an actual sample point (e.g. the actual sample produced by an A/D converter) which will be denoted as A', B', C', D', and E', and each ideal sample point A, B, C, D, and E. Additionally, and as explained below, positive (E_POS) and negative (E_NEG) side error signals are also generated corresponding to each actual sample point A', B', C', D', and E'.

Continuing with the above example, a positive side error signal E_POS for each actual sample point A', B', C', D' and E' may also be generated using the above equation E_POS (kT+T/2). Then, each positive side error signal may be calculated by taking the difference between each actual sample point A', B', C', D', and E' and each interpolated sample point A2 (in relation to ideal sample point A), B2 (in relation to ideal sample point B), C2 (in relation to ideal sample point C), D2 (in relation to ideal sample point D), and E2 (in relation to ideal sample point E; not shown).

Similarly, a negative side error signal E_NEG may also be obtained for each actual sample point A', B', C', D', and E' may also be generated using the above equation E_NEG (kT−T/2). Then, each negative side error signal may be calculated by taking the difference between each actual sample point A'−E', and interpolated sample point Z2 (in relation to ideal sample point A; not shown), A2 (in relation to ideal sample point B), B2 (in relation to ideal sample point C), C2 (in relation to ideal sample point D), D2 (in relation to ideal sample point E).

Put another way, exemplary sample points A, B, C, D and E shown in FIGS. 2 and 3 may be thought of as ideal samples (i.e., the samples that an A/D converter will produce in the absence of timing errors and other imperfections like noise). In practice, however, there will be flaws in timing and other imperfections such as noise. Hence, in the presence of those imperfections, the A/D converter will produce actual samples A', B', C', D' and E' which may be close to the samples A, B, C, D, and E. How close the actual samples A', B', C', D' and E' are to the ideal samples A, B, C, D and E depends upon the amount of imperfections in the PR channel, the difference between the actual samples A', B', C', D' and E' and the ideal samples A, B, C, D and E comprising the error signals.

It should be noted that in the absence of any imperfections, the A/D converter will produce the ideal samples A, B, C, D and E (instead of actual samples A', B', C', D' and E'), and hence the normal error signal E_N will be zero (e.g., A−A' will always be zero if A=A').

For example, the normal error E_N for sample point B' refers to the difference between the actual sample received from the A/D converter (B') and the ideal sample point B. E_POS for sample point B', for example, refers to the difference between the actual sample received from the A/D converter (B') and the ideal point B2 (obtained through interpolation). E_NEG for sample point B', for example, refers to the difference between the actual sample received from the A/D converter (B') and the ideal point A2 (obtained through interpolation).

As stated above, in the exemplary embodiment of the present invention, three (3) error signals E_N, E_POS, and E_NEG are generated, instead of just one (e.g., E_N). Although interpolated samples at points T/2 between each sample point A, B, C, D and E are shown in the exemplary embodiment discussed above, it will be noted that the above-described scheme may be generalized for any number of interpolated samples. If 1 equals the denominator of the increment, the number of increments, and hence the spacing between each increment may be controlled. First, E_N(kT) is computed. Then, E_POS (kT+(T/I)) can be computed as the error between the sample value at kT and the interpolated ideal sample value at kT+T/I. Similarly, E_NEG (kT−(T/I)) is computed as the error between the sample value at kT and the interpolated ideal value at kT−T/I. When the system is in lock and is tracking the signal, it is intuitive that E_N(kT) will be lesser in magnitude compared to the magnitudes of E_POS (kT+(T/I)) and E_NEG (kT−(T/I)).

By monitoring the three error signals E_N, E_POS, and E_NEG at every sampling instant kT, the direction of drift in the sampling phase may be detected as follows. For example, by creating a "window" of specific length, say 8T wide, and then performing filtering operations over the window length, the direction of drift may be detected. The filtering operations may comprise taking the summation of the absolute values for the three streams of error sequences E_N, E_POS and E_NEG over the window length. When the system is in lock, the sum corresponding to E_N will be smaller compared to those of E_POS and E_NEG. When a drift takes place in the sampling instants, and hence the sample vainness, the sum corresponding to either E_POS or E_NEG will be smaller compared to that of E_N, and hence the direction of drift may be detected.

To avoid misdetection of a LOL event, two or more consecutive occurrences where the sum corresponding to either E_POS or E_NEG is the smallest among the three sums should be observed. The E_POS and E_NEG are based on the ideal values at T/2 apart from the sampling instant, and therefore, whenever the sum corresponding to either E_POS or E_NEG tends to be smaller than that of E_N, it is intuitive that the sampling phase has drifted approximately T/4 from the ideal sampling instant. Thus, the amount of drift in the sampling clock, and the direction of drift are easily detected. By suitably modifying the frequency and/or phase integrators in the DPLL circuit (e.g., frequency register 430 and phase register 440 of DPLL 400 shown in FIG. 6) to provide an adjustment in the sampling phase corresponding to T/4 in the reverse direction of drift, it is possible to avoid a LOL event from happening. The adjustment signal can also be thought of as an additional phase error, which the DPLL applies to the integrators after gain shifting. As explained below, the required phase adjustment can also be achieved by applying the additional phase error in small increments over a period of time to the loop filter.

It will be noted that the above described scheme may be generalized to any sampling rate or "window" length. For example, by creating a "window" of any specific length, say WT wide, and then performing filtering operations over the window length, the direction of drift may be detected. The filtering operations may comprise taking the summation of the absolute values for the three streams of error sequences E_N(kT), E_POS (kT+(T/I)), and E_NEG (kT−(T/I)) over the window length W.

As also stated above, in order to avoid misdetection of a LOL event, it is preferred to see a specific number of consecutive occurrences (e.g., 2 consecutive occurrences) where the sum corresponding to either E_POS (kT+(T/I)) or E_NEG (kT−(T/I)) is the smallest among the three sums.

Figure 4:
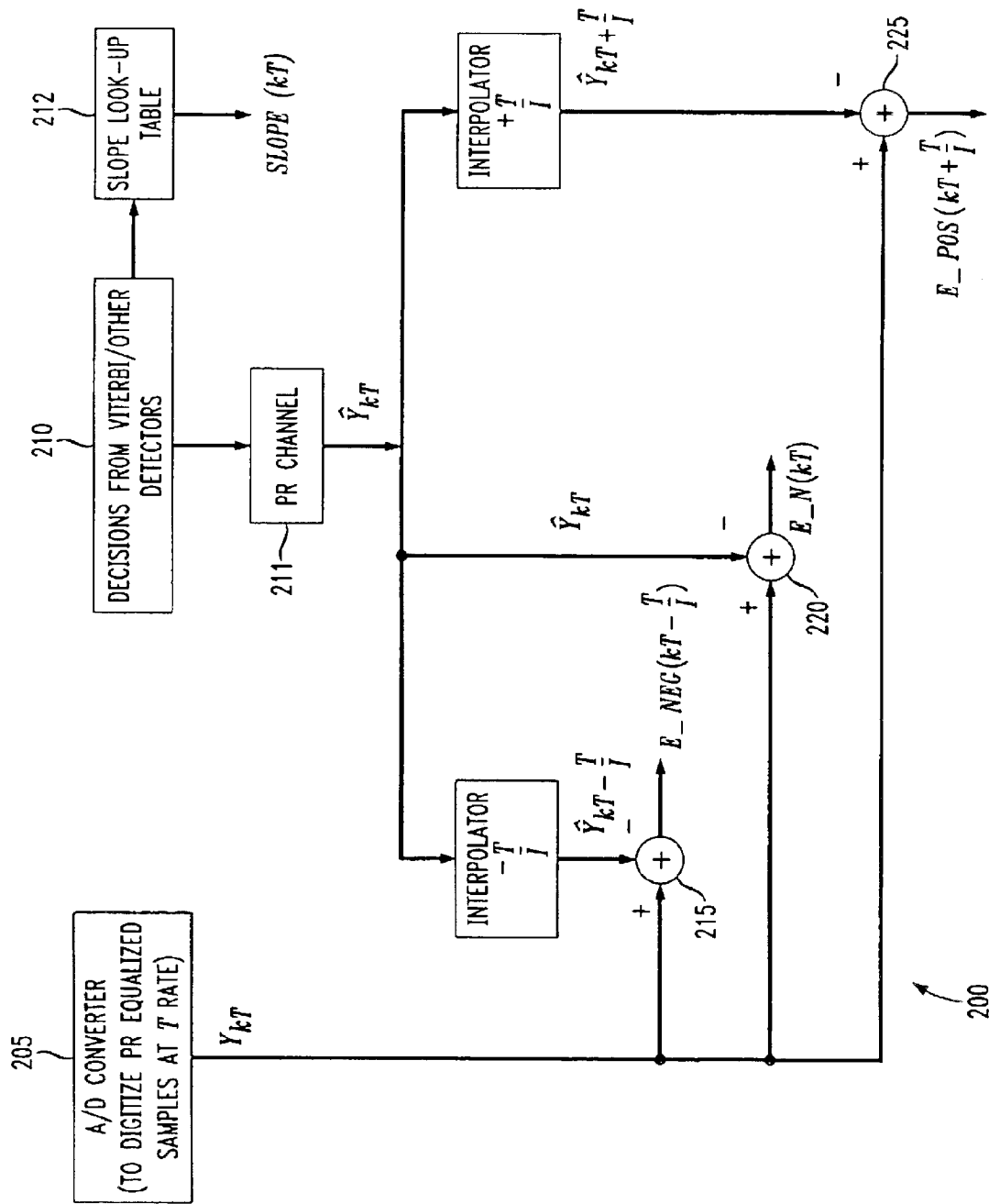
FIG. 4 shows a block diagram of an error generation circuit according to a first exemplary embodiment of the present invention.

FIG. 4 shows a block diagram of an error detection circuit 200 for producing three different error signals: EN, E_POS and E_NEG. The error detection circuit 200 includes an analog to digital (A/D) converter 205 for producing a digital output signal $Y_{kT}$ from a particular input signal. As discussed above in the Background, this digital output signal $Y_{kT}$ comprises a signal obtained by digitizing an analog 'readback' signal which has been filtered by a partial response (PR) channel filter.

A Viterbi (or other equivalent) detector 210 and a slope look-up table 212 are used to generate a SLOPE (kT) signal which is utilized in the digital phase lock loop (DPLL) circuit 400 described below (See FIG. 6). As also discussed above in the Background, the Viterbi detector 210 is also used in conjunction with the PR channel filter 211 to produce a signal $Y^1_{kT}$ which represents an ideal 'Y' signal (i.e., without noise or channel imperfections). The signals $Y_{kT}$ and $Y^1_{kT}$ are used to generate the error signals E_N, E_POS and E_NEG. In particular, the difference between the signals $Y_{kT}$ and $Y^1_{kT}$, $Y^1_{kT+T/I}$, and $Y^1_{kT-T/I}$ comprise the different error signals. For example, the difference between $Y_{kT}$ and $Y^1_{kT}$ comprises the error signal E_N (i.e., $Y_{kT}-Y^1_{kT}$), the difference between $Y_{kT}$ and $Y^1_{kT+T/I}$ comprises the error signal E_POS (i.e., $Y_{kT}-Y^1_{kT+T/I}$), and the difference between $Y_{kT}$ and $Y^1_{kT-T/I}$ comprises the error signal E_NEG (i.e., $Y_{kT}-Y^1_{kT-T/I}$). In order to produce the three error signals E_N, E_POS and E_NEG, the signals $Y_{kT}$ and $Y^1_{kT}$, $Y^1_{kT+T/I}$, and $Y_{kT+T/I}$ are added to one another at first, second and third adders 215, 220, 225 as explained below.

At the first adder 215, the signal $Y_{kT}$ is added to an interpolated version of $Y^1_{kT}$, namely $Y^1_{kT-T/I}$, the output of the first adder being the negative side error signal E_NEG. At the second adder 220, the signal $Y_{kT}$ is added to an $Y^1_{kT}$, the output of the second adder being the normal error signal E_N. Finally, at the third adder 225, the signal $Y_{kT}$ is added to an interpolated version of $Y^1_{kT}$, namely $Y^1_{kT+T/I}$, the output of the third adder being the positive side error signal E_POS.

The error signals E_N, E_POS and E_NEG produced by the error detection circuit 200 are used in a phase error adjustment circuit 300 in order to determine the proper phase adjustment signal to be applied to the digital phase lock loop.

Figure 5:
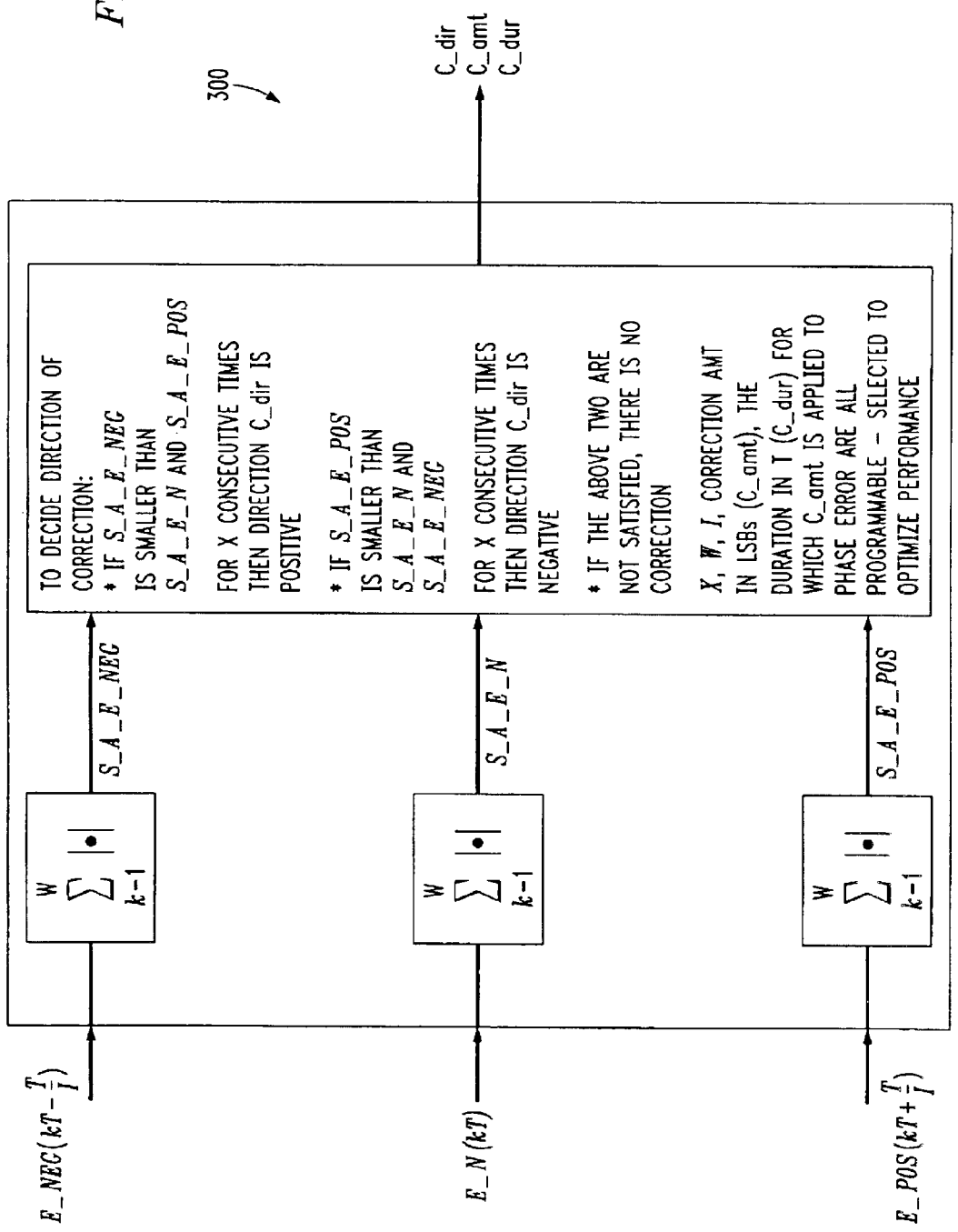
FIG. 5 shows a block diagram of a phase error adjustment circuit according to a first exemplary embodiment of the present invention.

FIG. 5 shows a block diagram of a phase error adjustment circuit 300 according to a first exemplary embodiment of the present invention. The phase error adjustment circuit 300 takes the error signals E_N, E_POS and E_NEG produced by the error detection circuit 200, and produces a phase adjustment signal which includes three pieces of information, including the direction adjustment C_dir, the amount of adjustment C_amt, and the duration of the adjustment C_dur. An algorithm operating within the phase error adjustment circuit 300 produces the C_dir (direction of drift), C_amt (the amount of adjustment to be applied to the phase error), and C_dur (the time duration for which the adjustment is made to the phase error) signals from summation error signals S_A_E_N, S_A_E_NEG, and S_A_E_POS signals.

The phase error adjustment circuit 300 takes each of the error signals E_N, E_POS and E_NEG, and produces summation error signals S_A_E_N, S_A_E_NEG, and S_A_E_POS by taking the absolute value of the sum of each stream of error signals. In particular, each sample in the error signals E_N, E_POS, and E_NEG has its absolute value taken, and then the value added to the respective sum. Each of the summation error signals S_A_E_N, S_A_E_NEG, and S_A_E_POS are input into a logic circuit portion of the phase error adjustment circuit which produces output signals C_dir, C_dur, and C_amt based on the input summation error signals.

The logic circuit portion of the phase error adjustment circuit 300 makes certain decisions based on the values of S_A_E_N, S_A_E_NEG, and S_A_E_POS. In order to determine the direction of drift C_dir, the logic compares the sums S_A_E_N, S_A_E_NEG and S_A_E_POS to each other. If S_A_E_NEG is less than both S_A_E_N and S_A_E_POS, then direction of drift is determined to be positive. If S_A_E_POS is less than both S_A_E_N and S_A_E_NEG, then direction of drift is determined to be negative. If neither of the above conditions are met, it is determined that no phase correction is required. Accordingly, C_dir may have a value of either +1, −1 or 0.

The remaining signals C_dur and C_amt produced by the phase error adjustment circuit 300 may be programmed into a memory of the phase error adjustment circuit by a user or by control circuitry. For example, if the sampling clock of the DPLL 400 needs to be advanced or retarded by a certain amount (e.g., T/4), the signals C_dur and C_amt can be programmed to accomplish this task. First, it should be noted that changes in the sampling clock are governed by the VCO of the DPLL 400 whose input comes from a phase register (e.g., phase register 440; FIG. 6) which in turn has input from a frequency register (e.g., frequency register 430; FIG. 6). Thus, there are multiple signals governing a change in sampling clock. Therefore, it should be noted that even though a change in the sampling clock may be required, it may not be necessary to provide the entire amount of change in the sampling clock because the DPLL 400 may adapt once a slight change in the proper direction is effected (i.e., the DPLL may self adapt to the right place and prevent a Loss of Lock from happening).

Therefore, C_amt could be made a value of +1, and C_dur could be made a value of 16T to achieve a required change in sampling clock. Similarly, C_amt could be made a value of +4, and C_dur could be made a value of 4T to achieve the same change. The former method has better steady state performance than the later as the change in the sampling clock is effected slowly.

When the digital phase lock loop circuit 400 (of which the phase error adjustment circuit 300 is an integral part) is in lock, the sum corresponding to E_N(kT), denoted by S_A_E_N in FIG. 5, will be smaller compared to those of E_POS (kT+(T/I)) and E_NEG (kT−(T/I), denoted by S_A_E_POS and S_A_E_NEG in FIG. 5, respectively. When a drift takes place in the sampling instants, and hence the sampled values, the sums S_A_E_POS and S_A_E_NEG will be smaller compared to S_A_E_N and hence the direction of drift can be detected.

The signals C_dir, C_amt, and C_dur generated by the phase error adjustment circuit 300 are used to correct phase errors in a digital phase lock loop circuit (DPLL) 400, explained below with reference to FIG. 6. In general, the signals C_dir, C_amt, and C_dur are applied to an adder 455 along with phase error signal PE to generate a corrected phase error signal C_PE(See FIG. 6).

As discussed above, E_POS (kT+(T/I)) and E_NEG (kT−(T/I)) are based on the interpolated ideal values at T/I apart from the sampling instant, and therefore, whenever S_A_E_POS and S_A_E_NEG tend to be smaller than S_A_E_N, it is intuitive that the sampling phase has drifted approximately (1T)/(2I) from the ideal sampling instant Thus, the amount of drift in the sampling clock and the direction of drift may be detected. By suitably modifying the frequency and/or phase integrators in the DPLL loop filter (e.g., frequency register 430 and phase register 440 of DPLL 400 shown in FIG. 6) to provide an adjustment in the sampling phase corresponding to (1T)/(2I) in the reverse direction of drift, it is possible to avoid a LOL event from happening. The adjustment signal can be thought of as an additional phase error, which the loop filter applies to the registers/integrators after gain shifting. The required phase adjustment can also be achieved by applying the additional phase error in small increments over a period of time to the loop filter to improve steady state performance like the Viterbi sequence detector bit error rate.

Figure 6:
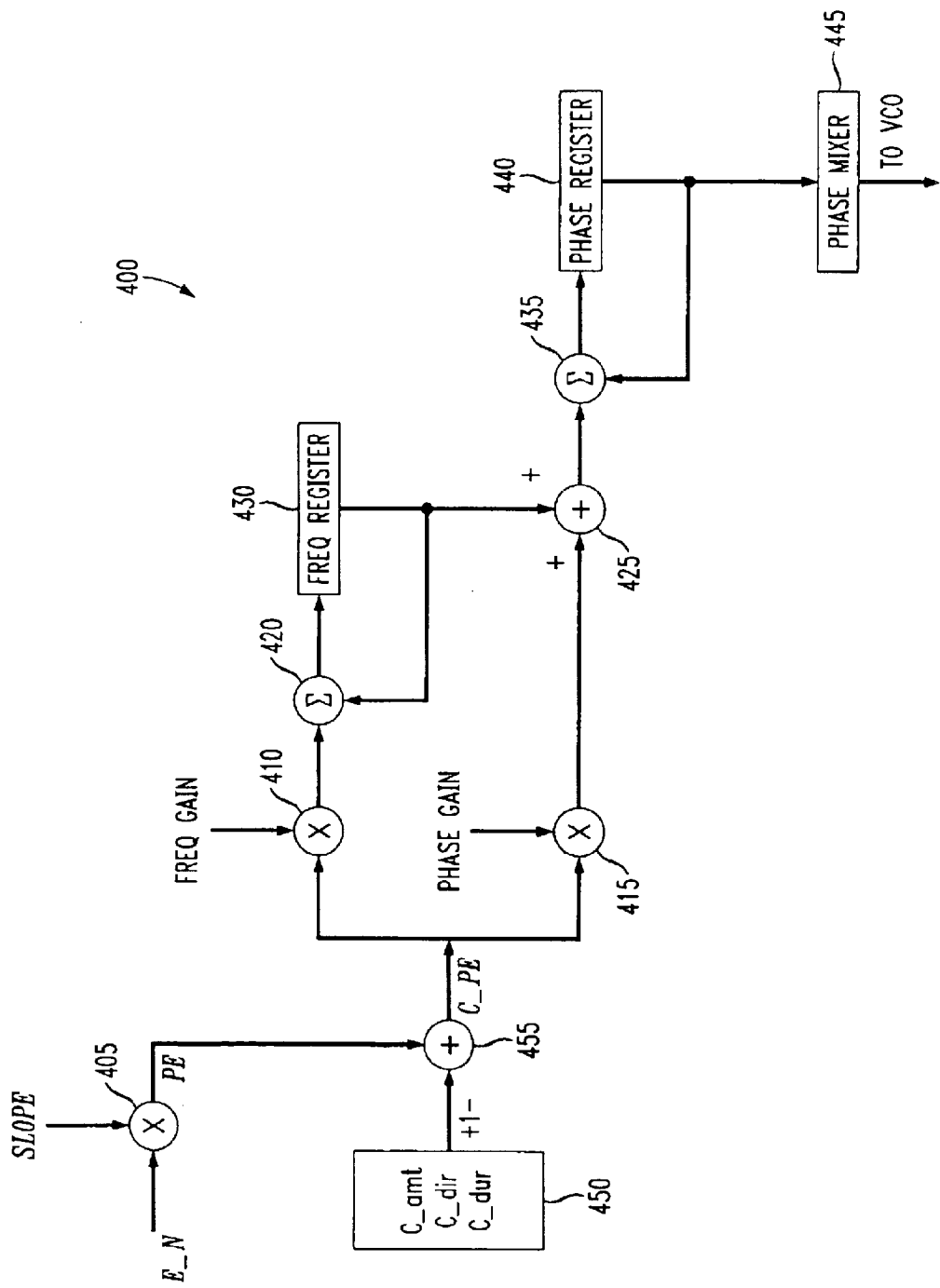
FIG. 6 shows a block diagram of a digital phase lock loop (DPLL) according to a first exemplary embodiment of the present invention.

FIG. 6 shows a block diagram of a digital phase lock loop (DPLL) circuit 400 according to a first exemplary embodiment of the present invention. The DPLL 400 includes many of the same elements as the conventional DPLL 100 shown in FIG. 1, and like reference numerals denote like elements.

One of the major differences in the DPLL 400 is the inclusion of the above-described error detection circuit 200 and phase error adjustment circuit 300, denoted as one unit by reference numeral 450. The error detection/adjustment circuit 450 provides signals C_dir, C_amt, and C_dur to an adder 455 which utilizes the three signals to create a corrected phase error signal C_PE. For example, if C_dur=5, C_amt=1 and C_dir=+, the adder 455 knows that it needs to add +1 for 5 clock cycles.

DPLL circuit 400 also includes a first multiplier 405 which receives an error signal E_N and a SLOPE signal from a Viterbi detector, and produces a phase error signal PE at its output. The PE signal is then input to adder 455 along with adjustment signals C_dir, C_amt, and C_dur (as discussed above) to produce corrected phase error signal C_PE. The second multiplier 410 also has a Frequency Gain signal input, and the third multiplier 415 also has a Phase Gain signal input. The output of the second multiplier 410 is transmitted to a first summer 420, and the output of the third multiplier is transmitted to a first adder 425. The first summer 420 takes the output of the second multiplier, and an output of a frequency register 430, and produces an output which is fed to the frequency register 430. The first adder 425 takes the output of the third multiplier 415, and an output of a frequency register 430, and produces an output which is fed to a second summer 435. The second summer 435 takes this signal, as well as an output signal from a phase register 440, and produces an output which is fed to the phase register 440. The output of the phase register 440 is then transmitted to a phase mixer 445. Finally, the phase mixer provides an output signal to control a voltage controlled oscillator (VCO).

In operation, the DPLL 400 described above generates the three different error signals E_N, E_POS, and E_NEG, and produces at least one corrected phase error signal C_PE, and modulates a control signal of a VCO so that the phase error in the control signal is minimized.

To optimize the DPLL circuit 400 for improving LOL while maintaining a good steady state performance such as the bit error rate, the parameters of the system such as I, X, W, C_dur and C_amt may be made variable or programmable. Furthermore, instead of monitoring the sum of absolute values (e.g., S_A_E_N, S_A_E_NEG, S_A_E_POS) of the three error sequences E_N, E_POS, and E_NEG, other functions like root mean square values, absolute sums, or simply the sum of squares or mean sum of squares may be monitored to determine the direction (C_dir), amount (C_amt) and duration (C_dir)of phase drift.

Figure 1:
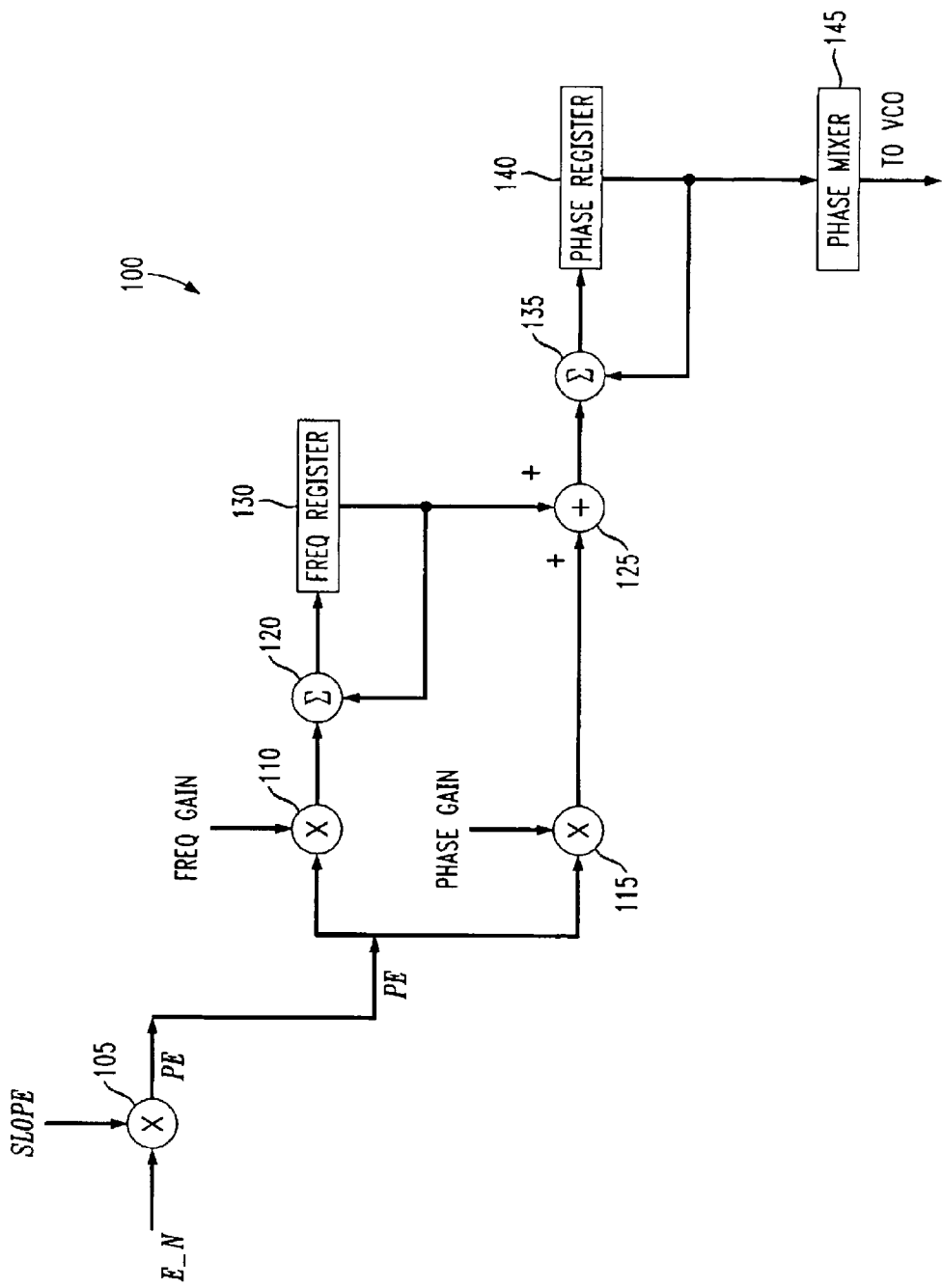
FIG. 1 is a block diagram showing a conventional digital phase lock loop (DPLL) circuit.

The DPLL circuit 400 is intended to reduce burst errors and improve the LOL performance from conventional timing recovery techniques (e.g., DPLL circuit 100; FIG. 1). Time-step simulation of the DPLL circuit 400 in a simulator (which models all the major portions of the read channel) shows that the LOL rates with the DPLL circuit 400 are at least two times lower than the LOL rate of the conventional system (e.g., DPLL 100). It will be noted that this is a significant improvement in LOL performance. Moreover, the steady state Viterbi sequence detector bit error rate is not significantly affected by the configuration of the DPLL circuit 400.

The DPLL 400 described above preferably includes a slope-based phase detector (PD). Slope-based phase detectors are also often referred to as Minimum Mean Squared Error Phase Detectors. It will be noted by those skilled in the art that other types of phase detectors may be used without departing from the scope of the present invention, such as Maximum Likelihood Phase Detectors and Mueller and Muller ('M&M') Phase Detectors.

Figure 7:
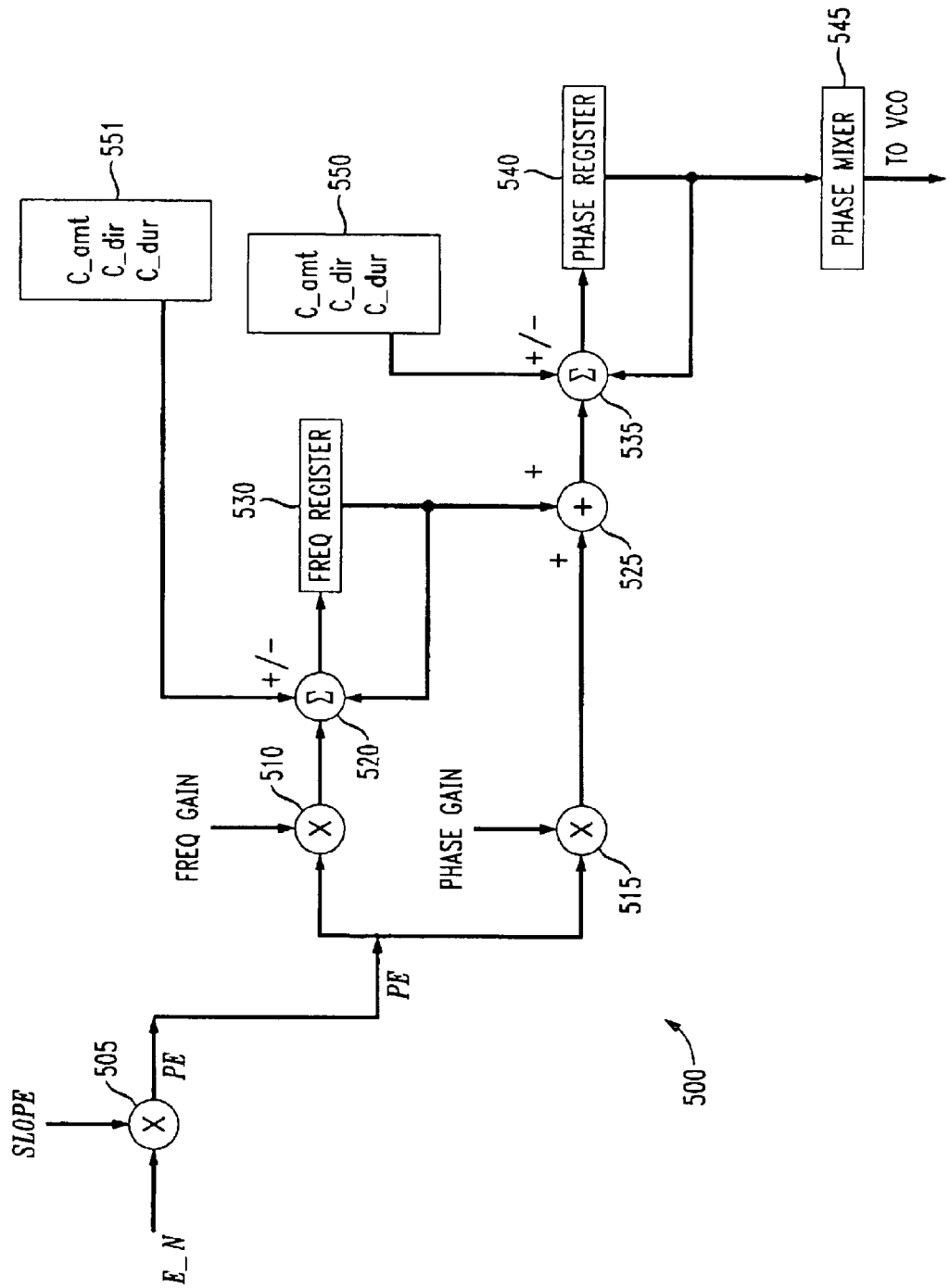
FIG. 7 shows a block diagram of a digital phase lock loop (DPLL) according to a second exemplary embodiment of the present invention.

FIG. 7 shows a block diagram of a digital phase lock loop (DPLL) circuit 500 according to a second exemplary embodiment of the present invention. The DPLL 500 includes many of the same elements as DPLL 400 shown in FIG. 6, and like reference numerals denote like elements.

As with the DPLL 400 described above, the DPLL 500 includes the above-described error detection circuit 200 and phase error adjustment circuit 300, denoted as two units by reference numerals 550, 551. The error detection/adjustment circuits 550, 551 provide adjustment signals C_dir, C_amt, and C_dur to summer 520 and summer 535. One of the major differences with the DPLL 500, as opposed to DPLL 400, is that the adjustment signals C_dir, C_amt, and C_dur are applied directly to the input of the Frequency Register 530 and Phase Register 540 (as opposed to at a point 'upstream' from the Frequency and Phase Registers; See FIG. 6). As will be appreciated by those skilled in the art, introducing the adjustment signals C_dir, C_amt, and C_dur directly to the input of the Frequency and Phase Registers 530, 540 may permit more accurate control over phase drift.

DPLL circuit 500 includes a first multiplier 505 which receives an error signal E_N and a SLOPE signal from a Viterbi (or other equivalent) detector, and produces a phase error signal PE at its output. The phase error signal PE is fed to a second multiplier 510 (which also has a Frequency Gain signal input), and a third multiplier 515 (with an additional Phase Gain signal input). The output of the second multiplier 510 is transmitted to a first summer 520, and the output of the third multiplier is transmitted to a first adder 525. The first summer 520 takes the output of the second multiplier, as well as adjustment signals C_dir, C_amt, and C_dur (as discussed above) and a feedback signal from a frequency register 530, and produces an output which is fed to the frequency register 530. The first adder 525 takes the output of the third multiplier 515, and an output of a frequency register 530, and produces an output which is fed to a second summer 535. The second summer 535 takes this signal, adjustment signals C_dir, C_amt, and C_dur, and a feedback signal from a phase register 540, and produces an output which is fed to the phase register 540. The output of the phase register 540 is then transmitted to a phase mixer 545. Finally, the phase mixer provides an output signal to control a voltage controlled oscillator (VCO).

Figure 8:
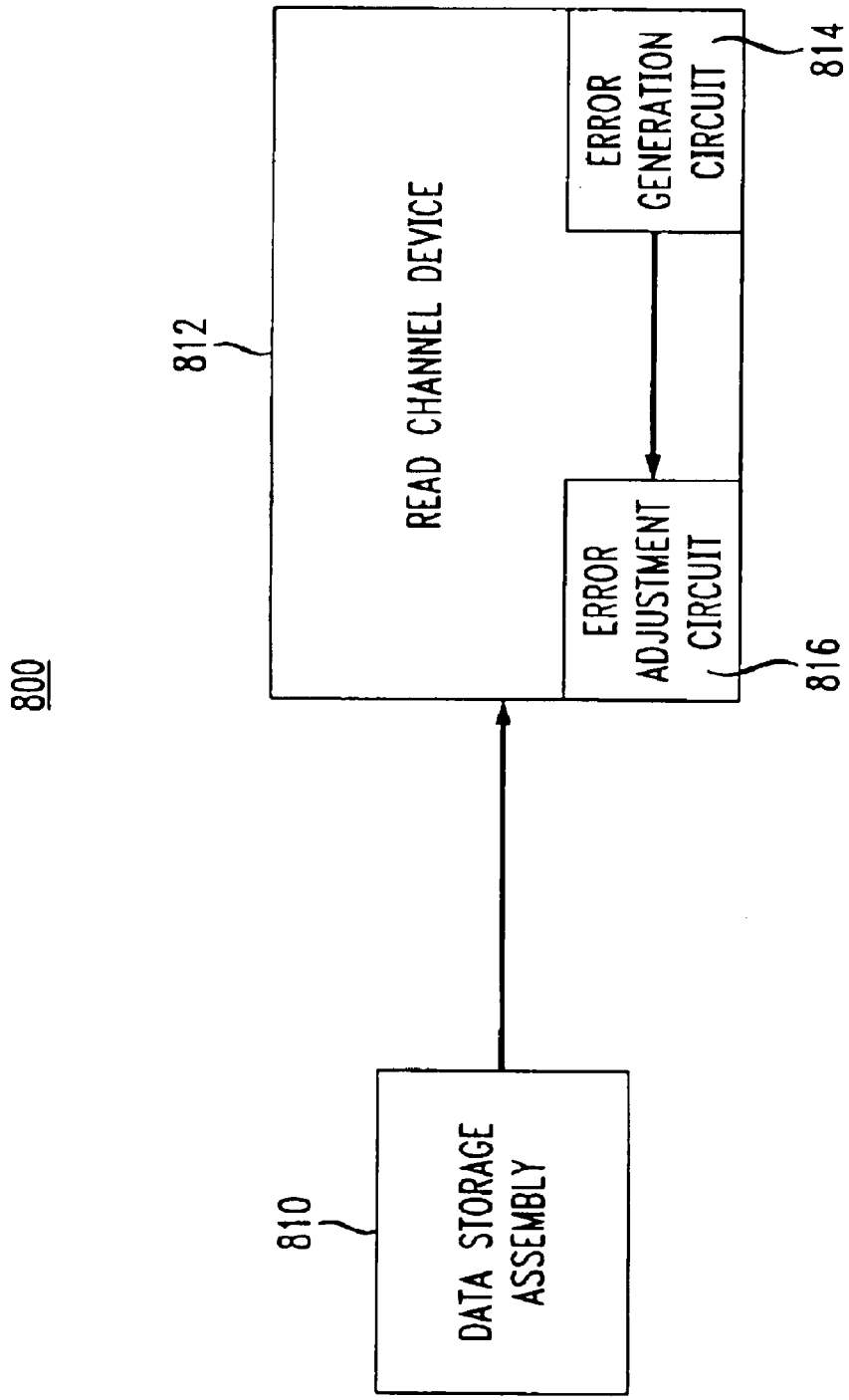
FIG. 8 is a block diagram of a data storage system.

FIG. 8 is a block diagram of a data storage system 800. The dat storage system 800 includes a data storage assembly 810, such as a hard disk drive, and a read channel device 812. In one embodiment, the read channel device comprises an error generation circuit 814, such as error generation circuit 200 of FIG. 4, and a phase error adjustment circuit, such as circuit 300 shown in FIG. 5.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A digital phase lock loop circuit for recovering a sampling clock comprising:
    an error generation circuit for generating at least three error signals from a sampled signal; and,
    a phase error adjustment circuit for generating at least first and second phase error adjustment signals from the at least three error signals for adjusting for at least an amount and direction of occurring phase drift, respectively, of a recovered sampling clock.

2. The digital phase lock loop circuit of claim 1, wherein the at least three error signals comprise:
    at least one first error signal, said first error signal corresponding to an error between a first sampled value from said sampled signal and a first ideal value for said sampled signal;
    at least one second error signal, said second error signal corresponding to an error between a second sampled value from said sampled signal, slightly ahead of the first sampled value in time, and the first ideal value; and,
    at least one third error signal, said third error signal corresponding to an error between a third sampled value from said sampled signal, slightly behind the first sampled value in time, and the first ideal value.

3. The digital phase lock loop circuit of claim 1, wherein the at least three error signals comprise:
    at least one first error signal, said first error signal corresponding to an error between a first sampled value from said sampled signal and a first ideal value for said sampled waveform;
    at least one second error signal, said second error signal corresponding to an error between a first interpolated sample value for said sampled signal, slightly ahead of the first sampled value in time, and the first ideal value; and,
    at least one third error signal, said third error signal corresponding to an error between a second interpolated sample value for said sampled signal, slightly behind the first sampled value in time, and the first ideal value.

4. The digital phase lock loop circuit of claim 1, wherein the at least three error signals comprise:
    at least one first error signal, said first error signal corresponding an error between a first sampled value from said sampled signal and a first ideal value for said sampled signal;
    at least one second error signal, said second error signal corresponding to an error between the first sampled value and a second ideal value for said sample signal which is slightly ahead of the first ideal value in time; and,
    at least one third error signal, said third error signal corresponding to an error between the first sampled value and a third ideal value for said sampled signal which is slightly behind the first ideal value in time.

5. The digital phase lock loop circuit of claim 4, wherein the at least one first error signal is produced by taking the difference between a first digital output signal corresponding to said sampled signal and a second digital output signal corresponding to said first ideal value.

6. The digital phase lock loop circuit of claim 5, wherein the at least one second error signal is produced by taking the difference between the first digital output signal and a phase shifted version of the second digital output signal, said phase shift being in a positive direction.

7. The digital phase lock loop circuit of claim 5, wherein the at least one second error signal is produced by taking the difference between the first digital output signal and a phase shifted version of the second digital output signal, said phase shift being in a negative direction.

8. The digital phase lock loop circuit of claim 1, wherein the at least first and second phase error adjustment signals further comprises at least one drift duration signal.

9. The digital phase lock loop of claim 1, further comprising an oscillator for generating said sampling clock, said oscillator responsive to a control signal for countering said occurring drift responsive to said at least one phase error adjustment signal.

10. The digital phase lock loop of claim 1, wherein the second phase error adjustment signal indicates a direction opposite said direction of said occurring phase drift.

11. A read channel device comprising:
    an error generation circuit for generating at least three error signals from a sampled signal; and,
    a phase error adjustment circuit for generating at least first and second phase error adjustment signals from the at least three error signals for adjusting for at least an amount and direction of occurring phase drift, respectively, of a recovered sampling clock.

12. A data storage system comprising:
    a data storage assembly;
    a read channel device operable to read information stored on the data storage assembly, said read channel device comprising an error generation circuit for generating at least three error signals from a sampled signal; and, a phase error adjustment circuit for generating at least first and second phase error adjustment signals from the at least three error signals indicative of at least an amount and direction of occurring phase drift, respectively, of a recovered sampling clock.

13. The data storage system of claim 12, wherein said data storage assembly comprises a hard disk drive.

14. A method for determining and correcting a phase error in a recovered sampling clock, comprising the steps of:
generating at least three error signals from a sampled signal; and,
generating at least first and second phase error adjustment signal from the at least three error signals for adjusting for at least an amount and direction of occurring phase drift, respectively, of said recovered sampling clock.

15. The method of claim 14, wherein the step of generating at least three error signals comprises:
generating at least one first error signal, said first error signal corresponding to an error between a first sampled value from said sampled signal and a first ideal value for the sampled signal;
generating at least one second error signal, said second error signal corresponding to an error between the first sampled value and a second ideal value for the sampled signal which is slightly ahead of the first ideal value in time; and,
generating at least one third error signal, said third error signal corresponding to an error between the first sampled value and a third ideal value for the sampled signal which is slightly behind the first ideal value in time.

16. The method of claim 15, wherein the step of generating the at least first and second phase error adjustment signals comprises the further step of:
generating at least one drift duration signal.

17. The method of claim 15, wherein the step of generating at least one phase error adjustment signal comprises:
generating at least one first summation error signal by taking the sum of a plurality of the at least one first error signals;
generating at least one second summation error signal by taking the sum of a plurality of the at least one second error signals; and,
generating at least one third summation error signal by taking the sum of a plurality of the at least one third error signals.

18. The method of claim 15, wherein the step of generating at least one phase error adjustment signal comprises:
generating at least one first summation error signal by taking the root mean square of a plurality of the at least one first error signals;
generating at least one second summation error signal by taking the root mean square of a plurality of the at least one second error signals; and,
generating at least one third summation error signal by taking the root mean square of a plurality of the at least one third error signals.

19. The method of claim 15, wherein the step of generating at least one phase error adjustment signal comprises:
generating at least one first summation error signal by taking the sum of the squares of a plurality of the at least one first error signals;
generating at least one second summation error signal by taking the sum of the squares of a plurality of the at least one second error signals; and,
generating at least one third summation error signal by taking the sum of the squares of a plurality of the at least one third error signals.

20. The method of claim 15, wherein the step of generating at least one phase error adjustment signal comprises:
generating at least one first summation error signal by taking the mean sum of the squares of a plurality of the at least one first error signals;
generating at least one second summation error signal by taking the mean sum of the squares of a plurality of the at least one second error signals; and,
generating at least one third summation error signal by taking the mean sum of the squares of a plurality of the at least one third error signals.

21. The method of claim 15, wherein the step of generating at least one phase error adjustment signal comprises:
generating at least one first summation error signal by taking the absolute sum of a plurality of the at least one first error signals;
generating at least one second summation error signal by taking the absolute sum of a plurality of the at least one second error signals; and,
generating at least one third summation error signal by taking the absolute sum of a plurality of the at least one third error signals.

22. The method of claim 17, comprising the further step of:
determining if the at least one third summation error signal is less than both the at least one first summation error signal and the at least one second summation error signal; and,
generating a phase error adjustment signal which is positive, if the at least one third summation error signal is less than both the at least one first summation error signal and the at least one second summation error signal.

23. The method of claim 17, comprising the further step of:
determining if the at least one second summation error signal is less than both the at least one first summation error signal and the at least one third summation error signal; and,
generating a phase error adjustment signal which is negative, if the at least one second summation error signal is less than both the at least one first summation error signal and the at least one third summation error signal.

24. The method of claim 14, the second phase error adjustment signal indicates a direction opposite said direction of said occurring phase drift.

25. A digital phase lock loop circuit for recovering a sampling clock, comprising:
an error generation circuit for generating at least three error signals from sampled signal sampled with said sampling clock, said at least three error signals comprising:
at least one first error signal, said first error signal corresponding an error between a first sampled value from said sampled signal and a first ideal value for said sampled signal;
at least one second error signal, said second error signal corresponding to an error between a second sampled value from said sampled signal, slightly ahead of the first sampled value in time, and the first ideal value; and
at least one third error signal, said third error signal corresponding to an error between a third sampled value from said sampled signal, slightly behind the first sampled value in time, and the first ideal value; and a phase error adjustment circuit for generating at least one phase error adjustment signal from the at least three error signals.

26. A digital phase Jock loop circuit for recovering a sampling clock, comprising:
- an error generation circuit for generating at least three error signals from sampled signal sampled with said sampling clock, said at least three error signals comprising:
  - at least one first error signal, said first error signal corresponding to an error between a first sampled value from said sampled signal and a first ideal value for said sampled waveform;
  - at least one second error signal, said second error signal corresponding to an error between a first interpolated sample value for said sampled signal, slightly ahead of the first sampled value in time, and the first ideal value; and,
  - at least one third error signal, said third error signal corresponding to an error between a second interpolated sample value for said sampled signal, slightly behind the first sampled value in time, and the first ideal value; and
- a phase error adjustment circuit for generating at least one phase error adjustment signal from the at least three error signals.

27. A digital phase lock loop circuit for recovering a sampling clock, comprising:
- an error generation circuit for generating at least three error signals from sampled signal sampled with said sampling clock, said at least three error signals comprising:
  - at least one first error signal, said first error signal corresponding to an error between a first sampled value from said sampled signal and a first ideal value for said sampled signal;
  - at least one second error signal, said second error signal corresponding to an error between the first sampled value and a second ideal value for said sampled signal which is slightly ahead of the first ideal value in time; and,
  - at least one third error signal, said third error signal corresponding to an error between the first sampled value and a third ideal value for said sampled signal which is slightly behind the first ideal value in time; and
- a phase error adjustment circuit for generating at least one phase error adjustment signal from the at least three error signals.

* * * * *